United States Patent
Chuang et al.

[11] Patent Number: 5,869,370
[45] Date of Patent: Feb. 9, 1999

[54] ULTRA THIN TUNNELING OXIDE USING BUFFER CVD TO IMPROVE EDGE THINNING

[75] Inventors: Kun-Jung Chuang, Peng-Hu; Hon-Hung Lui; Yi-Te Chen, both of Hsin-Chu, all of Taiwan

[73] Assignee: Taiwan Semiconductor Manufacturing Company Ltd., Hsin-Chu, Taiwan

[21] Appl. No.: 998,631

[22] Filed: Dec. 29, 1997

[51] Int. Cl.⁶ .................. H01L 21/8247; H01L 21/31; H01L 21/469

[52] U.S. Cl. ...................... 438/264; 438/762; 438/763

[58] Field of Search ...................... 438/762, 763, 438/257–267; 257/316

[56] References Cited

U.S. PATENT DOCUMENTS

| | | |
|---|---|---|
| 4,851,370 | 7/1989 | Doklan et al. . |
| 5,122,847 | 6/1992 | Kamiya et al. .................. 357/23.5 |
| 5,208,174 | 5/1993 | Mori . |
| 5,219,774 | 6/1993 | Vasché ........................... 437/43 |
| 5,352,619 | 10/1994 | Hong ............................. 437/43 |
| 5,360,769 | 11/1994 | Thakur et al. . |
| 5,371,028 | 12/1994 | Koh . |
| 5,411,904 | 5/1995 | Yamauchi et al. ................. 437/43 |
| 5,427,970 | 6/1995 | Hsue et al. ....................... 437/43 |
| 5,516,713 | 5/1996 | Hsue et al. ....................... 437/43 |
| 5,591,681 | 1/1997 | Wristers et al. . |
| 5,726,087 | 3/1998 | Tseng et al. . |

*Primary Examiner*—Richard A. Booth
*Attorney, Agent, or Firm*—George O. Saile; Stephen B. Ackerman; Rosemary L. S. Pike

[57] ABSTRACT

A new method of forming a tunneling oxide film having a uniform thickness in the fabrication of a Flash EEPROM memory cell is described. A first oxide layer is provided on the surface of a semiconductor substrate wherein a portion of the first oxide layer is removed to expose the semiconductor substrate wherein the exposed portion of the semiconductor substrate comprises a tunneling window. A second oxide layer is deposited within the tunneling window. Thereafter, a thermal oxide layer is grown underlying the first oxide layer and the second oxide layer within the tunneling area wherein the presence of the second oxide layer provides for a uniform thermal oxide thickness throughout the tunneling window and wherein the second oxide layer and the thermal oxide layer together within the tunneling window form the tunneling oxide film in the fabrication of a memory cell.

20 Claims, 6 Drawing Sheets

ULTRA THIN TUNNELING OXIDE USING BUFFER CVD TO IMPROVE EDGE THINNING

BACKGROUND OF THE INVENTION

1. Field of the Invention

The invention relates to a method of fabricating semiconductor memory devices employing floating gates, and more particularly, to a method of fabricating memory devices employing floating gates having an improved tunneling oxide.

2. Description of the Prior Art

One class of semiconductor memory devices employs floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. A tunneling oxide, necessary for the erase function of the cell, is situated below the floating gate of the memory cell. Typically, the tunneling oxide is formed by a thermal oxidation process. The inventors have found that the tunneling oxide is thinner at the edges of the thick oxide areas. This oxide edge thinning is thought to occur because there is less oxygen under the thick oxide areas to join in the oxidation reaction; thus, the growth rate of the tunneling oxide there will be lower than in the bare silicon area.

FIG. 1 illustrates a semiconductor substrate 10 on which have been formed thick oxide areas 11. Tunnel oxide 13 is grown on the surface of the substrate between the thick oxide areas 11, as shown in FIG. 2. The thickness T1 of the tunnel oxide 13 in the center portion is greater than the thickness T2 of the tunnel oxide at the edge portion by about 10 Angstroms. The thin oxide portion at the edge of the thick oxide is weak and easily damaged by charges, plasma, electric fields, etc. The weak thinning oxide will also form more surface states and charge or hole trapping centers. All of these effects reduce reliability, especially in EEPROM applications.

A similar tunneling oxide thinning has been observed adjacent to a field oxide region. This thinning is due to stress. Workers in the art have tried to improve this stress-related thinning by using a chemically vapor deposited (CVD) stacked gate oxide. This method is used in the U.S. Pat. No. 5,219,774 to Vasche and is illustrated in FIGS. 3–5. FIG. 3 illustrates a semiconductor substrate 10 in which Field OXide regions 12 have been formed. An oxide film 13 is formed by thermal oxidation, as shown in FIG. 4. It can be seen that oxide thinning occurs at the edges adjacent to the field oxide regions 12. Referring now to FIG. 5, an oxide film 14 is deposited over the thermal oxide layer 13 by chemical vapor deposition (CVD) and then densified. This smooths the film edge and improves the stress induced oxide thinning. However, the thinning effect caused by the thermal oxidation growth rate difference is not reduced.

U.S. Pat. Nos. 5,516,713 and 5,427,970 to Hsue et al, 5,352,619 to Hong, and 5,411,904 to Yamauchi et al teach methods of forming small tunneling oxide windows wherein tunneling oxide is thermally grown. U.S. Pat. No. 5,122,847 to Kamiya et al teaches forming a tunneling oxide by CVD at a high temperature of 700° C. or more for a film with a higher breakdown current density.

SUMMARY OF THE INVENTION

A principal object of the present invention is to provide an effective and very manufacturable method of fabricating a tunneling oxide film.

Another object of the present invention is to provide an effective and very manufacturable method of fabricating a tunneling oxide film in the fabrication of a flash EEPROM memory cell.

A further object of the invention is to provide a method of forming a tunneling oxide film with reduced edge thinning.

Yet another object is to provide a method for forming a tunneling oxide film having a reduced tunneling gate leakage.

In accordance with the objects of this invention a new method of forming a tunneling oxide film having a uniform thickness in the fabrication of a Flash EEPROM memory cell is achieved. A first oxide layer is provided on the surface of a semiconductor substrate wherein a portion of the first oxide layer is removed to expose the semiconductor substrate wherein the exposed portion of the semiconductor substrate comprises a tunneling window. A second oxide layer is deposited within the tunneling window. Thereafter, a thermal oxide layer is grown underlying the first oxide layer and the second oxide layer within the tunneling area wherein the presence of the second oxide layer provides for a uniform thermal oxide thickness throughout the tunneling window and wherein the second oxide layer and the thermal oxide layer together within the tunneling window form the tunneling oxide film in the fabrication of a memory cell.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a uniform thin silicon oxide layer where there is thick oxide at the edge of the thin oxide area. The invention will be described in detail with reference to FIGS. 6–12 which illustrate a method of forming a tunneling oxide film in the fabrication of a Flash EEPROM memory cell.

Figure 6:
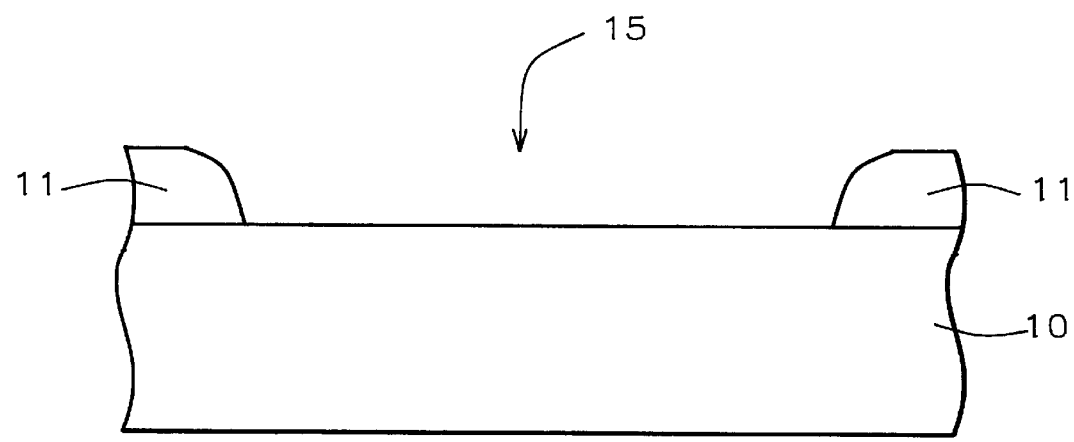
FIGS. 6 through 8 schematically illustrate in cross-sectional representation a preferred embodiment of the present invention.

Referring now more particularly to FIG. 6, there is illustrated a portion of a partially completed memory cell. Semiconductor substrate 10 is preferably composed of monocrystalline silicon. A relatively thick gate oxide layer is grown by thermal oxidation over the surface of the substrate to a thickness of about 200 Angstroms. A tunneling window 15 is opened in the thermal oxide.

Figure 7:
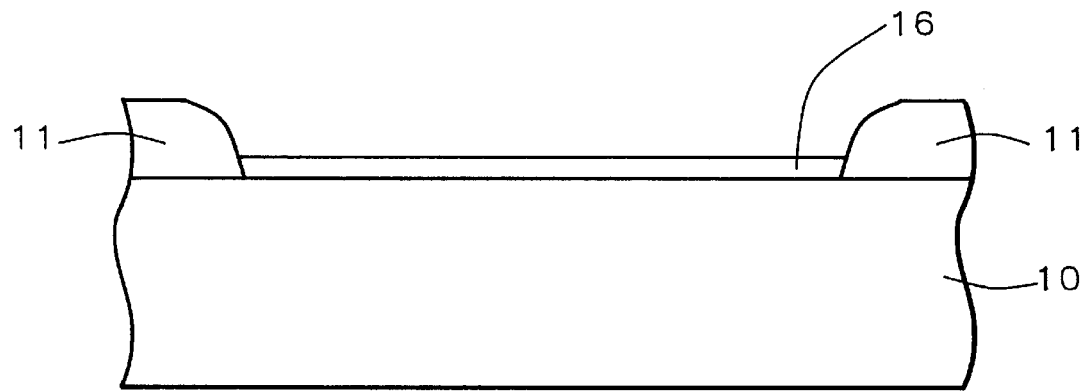

Referring now to FIG. 7, a layer of silicon oxide 16 is deposited by chemical vapor deposition over the surface of the substrate and within the tunneling window 15. The silicon oxide layer 16 is deposited to a thickness of between about 20 and 70 Angstroms, or preferably 25 to 50 Angstroms.

Figure 8:
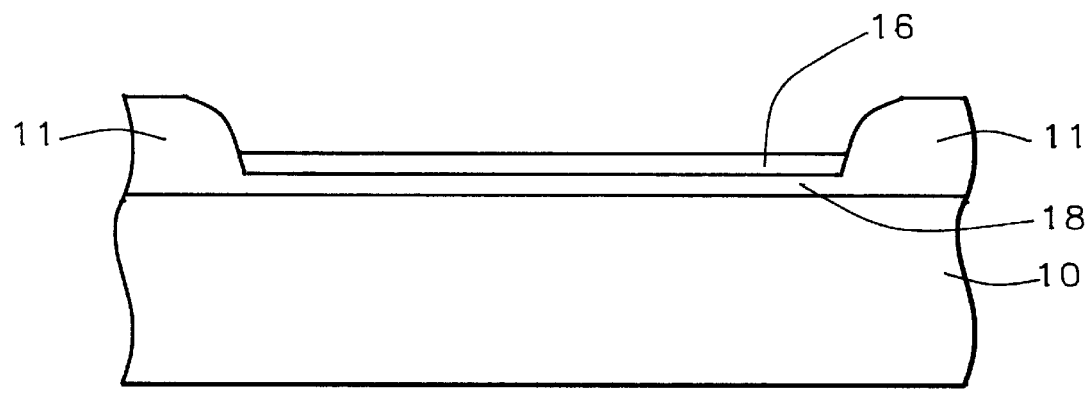

Next, as illustrated in FIG. 8, a layer of silicon dioxide 18 is grown by thermal oxidation of the silicon substrate underlying the CVD oxide layer 16 and the thick oxide areas 11. The thickness of the thermal oxide layer 18 under the CVD oxide layer is between about 20 and 80 Angstroms, or preferably 25 to 70 Angstroms. An advantage of this stacked oxide layer 16 and 18 is the lowering of pin hole density because of the mismatch of pin holes in the two layers.

Figure 1:
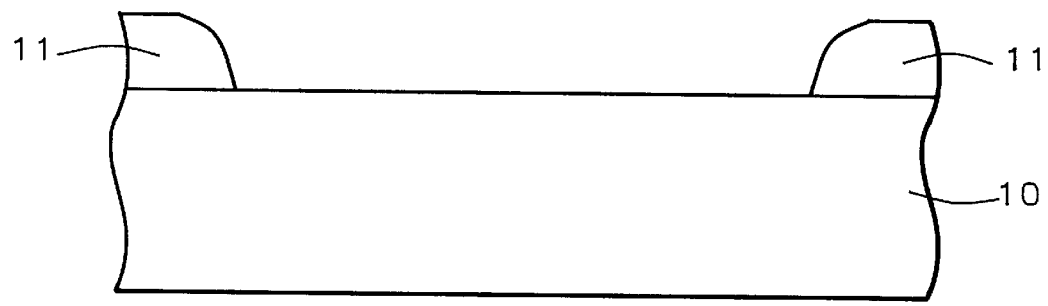
FIGS. 1 and 2 schematically illustrate in cross-sectional representation a first method of forming a tunneling oxide film in the prior art.
Figure 2:
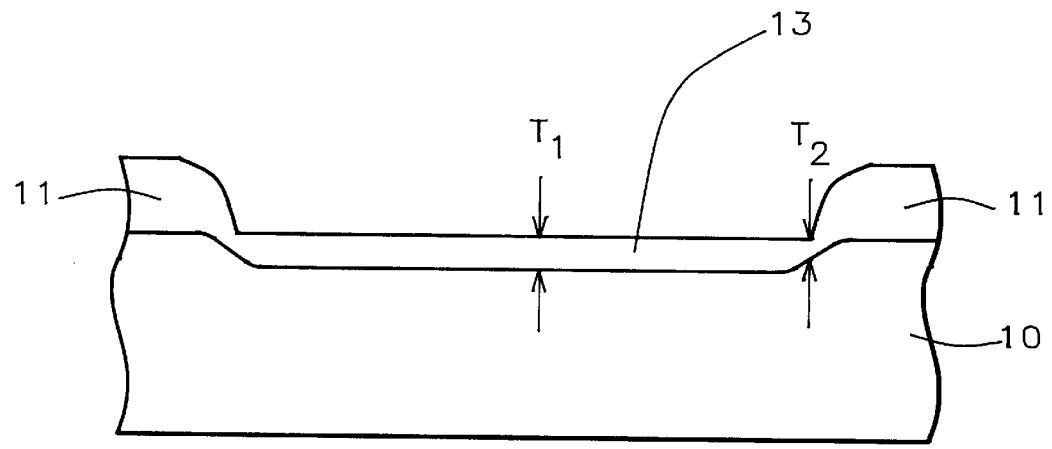
Figure 3:
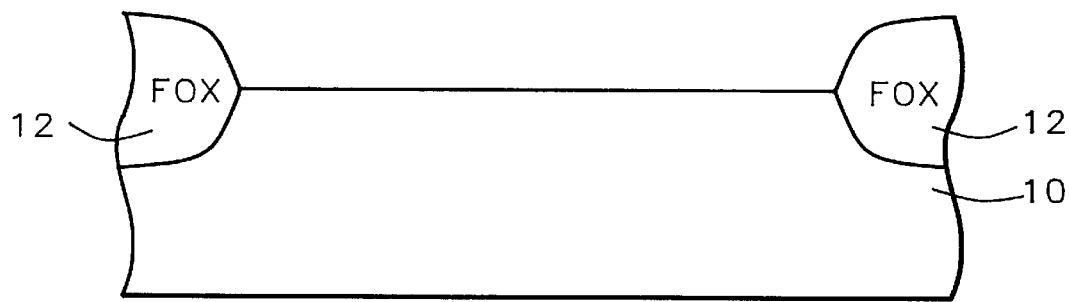
FIGS. 3 through 5 schematically illustrate in cross-sectional representation a second method of forming a tunneling oxide film in the prior art.
Figure 4:
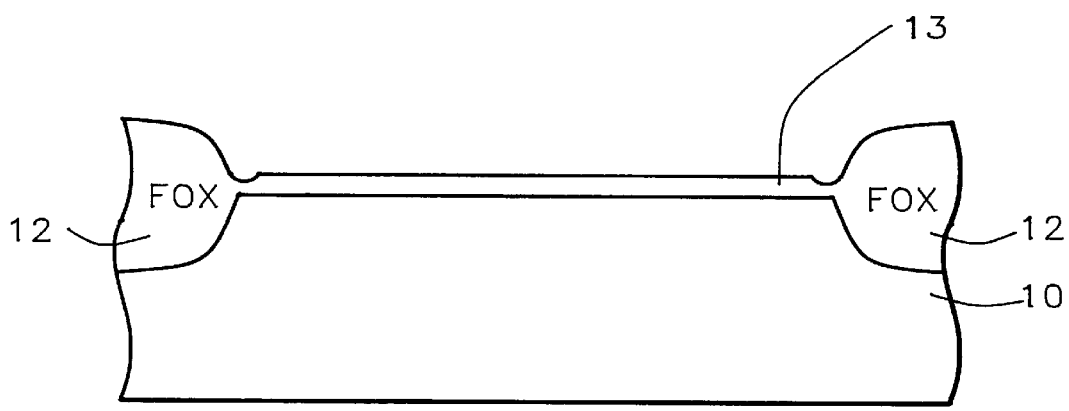
Figure 5:
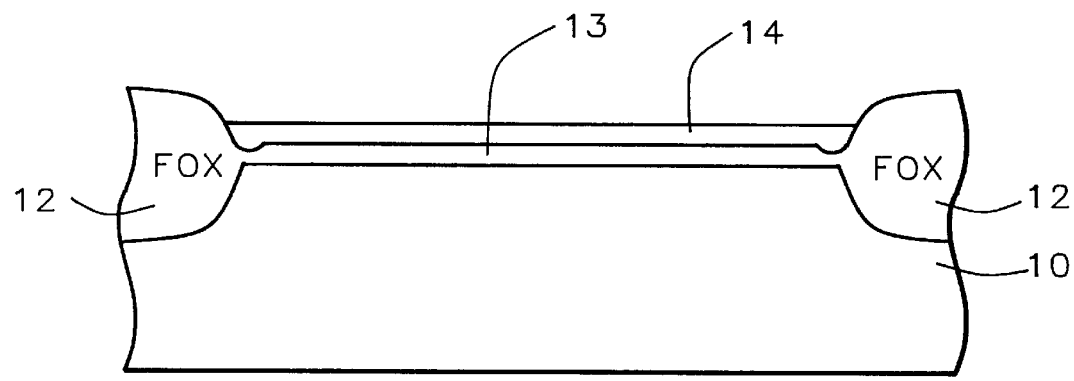
Figure 9:
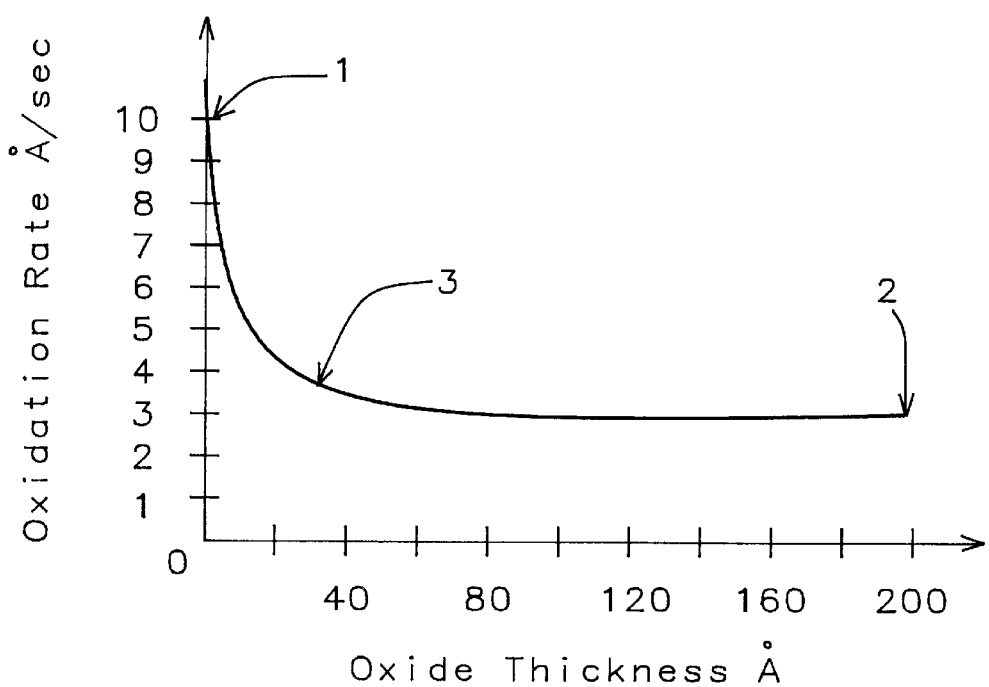
FIG. 9 graphically illustrates oxidation rate versus oxide thickness.

As shown in *Silicon Processing for the VLSI Era*, Vol. 2, by Wolf et al, p. 673, FIG. 5, oxidation rate varies with oxide thickness. As shown in FIG. 9, the growth rate of oxide on bare silicon is about 10 Angstroms/sec (point 1) while the growth rate of oxide on the thick oxide regions 11 is about 3 Angstroms/sec (point 2). The presence of the CVD oxide layer 16 avoids the high oxidation rate at the beginning of thermal oxidation. The oxidation rate will be close to 3 Angstroms/sec (point 3). Therefore, the thin tunneling oxide will have a consistent thickness both at its center and at its edge next to the thick oxide regions 11. The consistent, uniform thickness of the tunneling oxide reduces tunneling gate leakage, charge trapping, surface state formation, charge damage, and antenna effect induced oxide damage thereby improving the reliability of the resulting memory cell. The thickness of the tunneling oxide; that is, the combined layers 16 and 18, is between about 45 and 110 Angstroms, or preferably 50 to 105 Angstroms.

Figure 10:
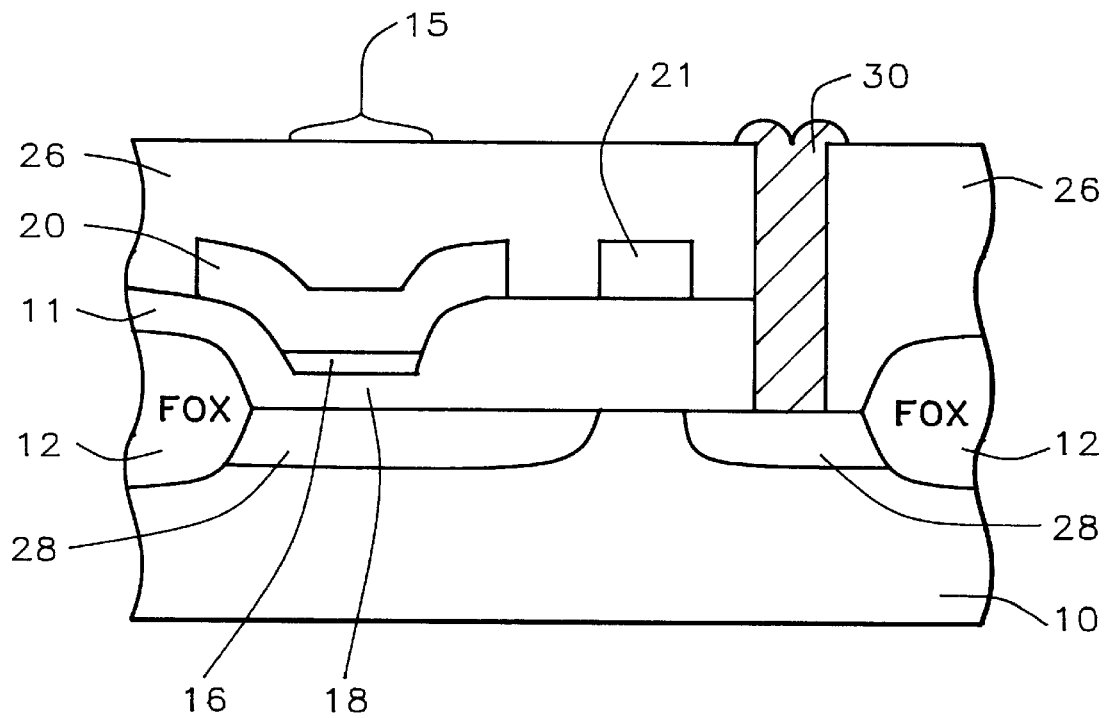
FIG. 10 schematically illustrates in cross-sectional representation a completed memory cell of the present invention and view 10—10 of FIG. 11.
Figure 11:
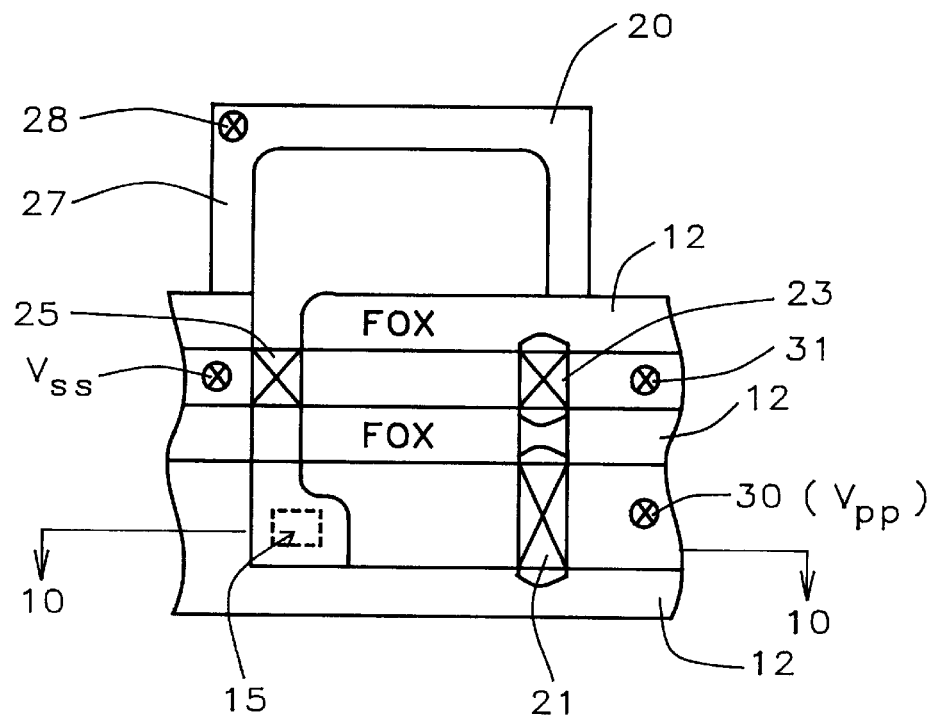
FIG. 11 schematically illustrates in top view a completed memory cell of the present invention.

Processing continues, as is conventional in the art, to form the integrated circuit device, such as the EEPROM illustrated in FIG. 10. FIG. 10 is the cross-section 10—10 of top view FIG. 11. A layer of polysilicon is deposited over the surface of the substrate and patterned to form the floating gate 20 and the high current bypass transistor 21. Source and drain regions 28 are formed within the substrate. A dielectric layer 26 such as borophosphosilicate glass (BPSG) is deposited over the surface of the substrate. Contact openings are etched through the dielectric layer to expose drain regions 28 where contact is desired. Metal layer 30, typically aluminum, is deposited and patterned to complete the contacts. FIG. 11 illustrates the tunneling window 15 under the floating gate 21. The high current bypass transistor 21 and the write contact ($V_{pp}$) 30 are illustrated in cross-section 10—10. Also illustrated are the read transistor 25, select transistor 23 and diffused control gate 27 and contacts 28, $V_{ss}$, and read contact 31.

Figure 12:
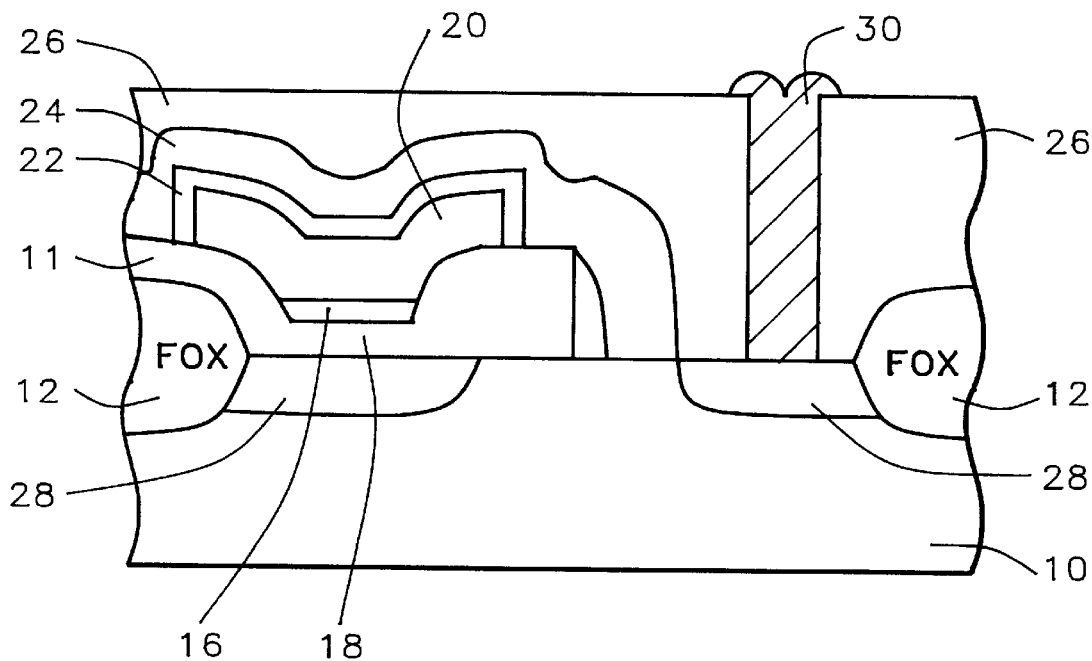
FIG. 12 schematically illustrates in cross-sectional representation a completed memory cell of the present invention.

FIG. 12 illustrates a stacked gate EEPROM wherein an interpoly dielectric 22, such as ONO (silicon oxide-silicon nitride-silicon oxide) is deposited over the floating gate 20. A second polysilicon layer or a polycide layer is deposited over the dielectric 22 and patterned to form the control gate 24 of the memory cell. As in the single poly EEPROM of FIGS. 10 and 11, source and drain regions 28 are formed within the substrate. A dielectric layer 26 such as borophosphosilicate glass (BPSG) is deposited over the surface of the substrate. Contact openings are etched through the dielectric layer to expose drain regions 28 where contact is desired. Metal layer 30, typically aluminum, is deposited and patterned to complete the contacts.

EXAMPLE

The following Example is given to show the important features of the invention and to aid in the understanding thereof. Variations may be made by one skilled in the art without departing from the spirit and scope of the invention.

The process of the invention has been performed experimentally. In a conventional process, a thermal oxide was grown within a tunneling window on bare silicon to a thickness of 75 Angstroms. It was found that the thermal oxide at the edge of the tunneling window next to the thick oxide was about 30 Angstroms thinner than the 75 Angstroms at the center of the tunneling window.

In the process of the invention, the second oxide layer 16 was deposited by CVD to a thickness of between about 35 and 40 Angstroms. The thermal oxide layer 18 was grown underlying the first and second oxide layers at 950° C. The thermal oxide thickness would have been 40 Angstroms on bare silicon. The actual thickness was calculated by the lattice distance of silicon, using the Transmission Electron Micrograph (TEM), to be about 25 Angstroms. No significant edge thinning was found. The thickness of the tunneling oxide was found to range from about 59 to 65 Angstroms.

The process of the present invention provides an ultra thin tunneling oxide with an improved edge thinning effect. No changes are required to the tunneling window mask. The formation of the tunneling oxide of the invention results in lowering of the tunneling gate leakage because the tunneling oxide is not thinned around the thick oxide edge. Because there is no thinner tunneling oxide area, charge trapping, surface state formation, charge damage, and antenna effect induced oxide damage are all reduced.

While the invention has been particularly shown and described with reference to the preferred embodiments thereof, it will be understood by those skilled in the art that various changes in form and details may be made without departing from the spirit and scope of the invention.

What is claimed is:

1. A method of forming a tunneling oxide film having a uniform thickness in the fabrication of a memory cell comprising:

providing a first oxide layer on the surface of a semiconductor substrate wherein a portion of said first oxide layer is removed to expose said semiconductor substrate wherein said exposed portion of said semiconductor substrate comprises a tunneling window;

depositing a second oxide layer within said tunneling window directly contacting said semiconductor substrate; and thereafter, growing a thermal oxide layer underlying said first oxide layer and said second oxide layer within said tunneling window wherein the presence of said second oxide layer provides for a uniform thermal oxide thickness throughout said tunneling window and wherein said second oxide layer and said thermal oxide layer together within said tunneling window form said tunneling oxide film in the fabrication of said memory cell.

2. The method according to claim 1 wherein said first oxide layer has a thickness of about 200 Angstroms.

3. The method according to claim 1 wherein said second oxide layer is deposited by chemical vapor deposition to a thickness of between about 20 and 70 Angstroms.

4. The method according to claim 1 wherein said second oxide layer is deposited by chemical vapor deposition to a thickness of between about 25 and 50 Angstroms.

5. The method according to claim 1 wherein said thermal oxide layer has a thickness of between about 20 and 80 Angstroms.

6. The method according to claim 1 wherein said thermal oxide layer has a thickness of between about 25 and 70 Angstroms.

7. The method according to claim 1 wherein said tunnel oxide film has a thickness of between about 45 and 110 Angstroms.

8. The method according to claim 1 wherein said tunnel oxide film has a thickness of between about 50 and 105 Angstroms.

9. A method of forming a tunneling oxide film having a uniform thickness in the fabrication of a memory cell comprising:

provinding a first oxide layer on the surface of a semiconductor substrate wherein a portion of said first oxide layer is removed to expose said semiconductor substrate wherein said exposed portion of said semiconductor substrate comprises a tunneling window;

depositing a second oxide layer within said tunneling window directly contacting said semiconductor substrate; and thereafter, growing a thermal oxide layer underlying said first oxide layer and said second oxide layer within said tunneling window wherein the presence of said second oxide layer provides for a uniform thermal oxide thickness throughout said tunneling window and wherein said second oxide layer and said thermal oxide layer together within said tunneling window form said tunneling oxide film;

depositing a polysilicon layer overlying said tunneling oxide film and patterning said polysilicon layer to form a floating gate overlying said tunneling window and a control gate overlying another portion of said semiconductor substrate; and providing passivation and metallization to complete the fabrication of said memory cell.

10. The method according to claim 9 wherein said first oxide layer has a thickness of about 200 Angstroms.

11. The method according to claim 9 wherein said second oxide layer is deposited by chemical vapor deposition to a thickness of between about 20 and 70 Angstroms.

12. The method according to claim 9 wherein said second oxide layer is deposited by chemical vapor deposition to a thickness of between about 25 and 50 Angstroms.

13. The method according to claim 9 wherein said thermal oxide layer has a thickness of between about 20 and 80 Angstroms.

14. The method according to claim 9 wherein said thermal oxide layer has a thickness of between about 25 and 70 Angstroms.

15. The method according to claim 9 wherein said tunnel oxide film has a thickness of between about 45 and 110 Angstroms.

16. The method according to claim 9 wherein said tunnel oxide film has a thickness of between about 50 and 105 Angstroms.

17. A method of forming a tunneling oxide film having a uniform thickness in the fabrication of a memory cell comprising:

providing a first oxide layer on the surface of a semiconductor substrate wherein a portion of said first oxide layer is removed to expose said semiconductor substrate wherein said exposed portion of said semiconductor substrate comprises a tunneling window;

depositing a second oxide layer within said tunneling window directly contacting said semiconductor substrate; and thereafter, growing a thermal oxide layer underlying said first oxide layer and said second oxide layer within said tunneling window wherein the presence of said second oxide layer provides for a uniform thermal oxide thickness throughout said tunneling window and wherein said second oxide layer and said thermal oxide layer together within said tunneling window form said tunneling oxide film;

depositing a first polysilicon layer overlying said tunneling oxide film;

depositing an interpoly dielectric layer over said first polysilicon layer;

patterning said first polysilicon layer and said interpoly dielectric layer to form a floating gate in said tunneling area;

depositing a second conducting layer overlying said interpoly dielectric layer and patterning said second conducting layer to form a control gate; and providing passivation and metallization to complete the fabrication of said memory cell.

18. The method according to claim 17 wherein said first oxide layer has a thickness of about 200 Angstroms.

19. The method according to claim 17 wherein said second oxide layer is deposited by chemical vapor deposition to a thickness of between about 25 and 50 Angstroms.

20. The method according to claim 17 wherein said thermal oxide layer has a thickness of between about 25 and 70 Angstroms.

* * * * *

UNITED STATES PATENT AND TRADEMARK OFFICE
CERTIFICATE OF CORRECTION

PATENT NO.    : 5,869,370
DATED         : February 9, 1999
INVENTOR(S)   : Kun-Jung Chuang, Hon-Hung Lui, Yi-Te Chen It is certified that error appears in the above-identified patent and that said Letters Patent is hereby corrected as shown below:

Title page,
Item [54], delete "ULTRA THIN TUNNELING OXIDE USING BUFFER CVD TO IMPROVE EDGE THINNING" and replace with -- NOVEL ULTRA THIN TUNNELING OXIDE USING BUFFER CVD OXIDE TO IMPROVE EDGE THINNING EFFECT --.

Signed and Sealed this

Twenty-third Day of October, 2001

Attest:

*Nicholas P. Godici*

NICHOLAS P. GODICI
*Attesting Officer*   *Acting Director of the United States Patent and Trademark Office*